(12) United States Patent
Cui

(10) Patent No.: US 10,868,095 B2
(45) Date of Patent: Dec. 15, 2020

(54) PIXEL DEFINING LAYER, DISPLAY SUBSTRATE AND METHOD FOR MANUFACTURING THE SAME, AND DISPLAY DEVICE

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/353,768

(22) Filed: Mar. 14, 2019

(65) Prior Publication Data

US 2019/0371873 A1    Dec. 5, 2019

(30) Foreign Application Priority Data

May 31, 2018    (CN) ........................ 2018 1 0556743

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0005* (2013.01); *H01L 51/56* (2013.01); *H01L 2227/323* (2013.01)

(58) Field of Classification Search
CPC . H01L 27/3246; H01L 51/0005; H01L 51/56; H01L 2227/323

USPC .......................................................... 257/40
See application file for complete search history.

(56) References Cited

U.S. PATENT DOCUMENTS

| 2008/0218654 | A1 | 9/2008 | Kai et al. | |
|---|---|---|---|---|
| 2011/0260955 | A1* | 10/2011 | Yoshida | H01L 27/3246 345/76 |
| 2016/0043150 | A1* | 2/2016 | Wang | H01L 51/56 257/40 |

FOREIGN PATENT DOCUMENTS

CN    105206643 A    12/2015

OTHER PUBLICATIONS

First Office Action issued in corresponding Chinese Application No. 201810556743.5, dated Mar. 16, 2020, with English translation.

* cited by examiner

*Primary Examiner* — Tu-Tu V Ho
(74) *Attorney, Agent, or Firm* — McDermott Will & Emery LLP

(57) ABSTRACT

A pixel defining layer includes at least one defining unit group disposed on one side of a base substrate. Each of the at least one defining unit group includes a plurality of defining subunits. Each of the plurality of defining subunits is provided with a defining groove. Defining grooves of any two adjacent defining subunits in each defining unit group are communicated with each other.

15 Claims, 5 Drawing Sheets

PIXEL DEFINING LAYER, DISPLAY SUBSTRATE AND METHOD FOR MANUFACTURING THE SAME, AND DISPLAY DEVICE

CROSS-REFERENCE TO RELATED APPLICATION

This application claims priority to Chinese Patent Application No. 201810556743.5, filed on May 31, 2018, titled "A PIXEL DEFINING LAYER, DISPLAY SUBSTRATE AND METHOD FOR MANUFACTURING THE SAME, AND DISPLAY DEVICE", which is incorporated herein by reference in its entirety.

TECHNICAL FIELD

The present disclosure relates to the field of display technologies, and in particular, to a pixel defining layer, a display substrate and a method for manufacturing the same, and a display device.

BACKGROUND

As a non-contact, pressure-free printing film-forming technology requiring no printing plates, ink-jet printing technology has the advantages of simple operation, low cost, and being able to form large-sized films, and is thus widely used in the display manufacturing field, such as in manufacturing polymer light-emitting diodes (PLED), color filters of liquid crystal displays (LCD), organic thin film transistors, metal electrodes, and three-dimensional isolation walls.

SUMMARY

In an aspect, a pixel defining layer is provided. The pixel defining layer includes at least one defining unit group disposed on one side of a base substrate. Each defining unit group includes a plurality of defining subunits, and each defining subunit is provided with a defining groove. Defining grooves of any two adjacent defining subunits in each defining unit group are communicated with each other.

In some embodiments, each defining unit group is configured to define a kind of light-emitting films of a same composition.

In some embodiments, each defining groove includes a pixel defining groove and a guiding groove communicated with the pixel defining groove, and the guiding groove is disposed at a side of the pixel defining groove away from the base substrate. The pixel defining layer further includes a communicating groove disposed between any two adjacent guiding grooves in each defining unit group, so that the any two adjacent guiding grooves in each defining unit group are communicated with each other by the communicating groove.

In some embodiments, each pixel defining groove in each defining unit group has a same depth.

In some embodiments, in each defining groove, a bottom surface of a guiding groove is provided with an opening directly facing a pixel defining groove, and an orthographic projection of the pixel defining groove on the base substrate is within an orthographic projection of the opening on the base substrate.

In some embodiments, bottom surfaces of any two adjacent guiding grooves in each defining unit group are in a same plane.

In some embodiments, a bottom surface of each communicating groove is in a same plane as bottom surfaces of two guiding grooves that are communicated with the communicating groove.

In some embodiments, an orthographic projection of a pixel defining groove of each defining groove on the base substrate is within an orthographic projection of a guiding groove of the defining groove on the base substrate.

In some embodiments, in each defining groove, along a direction from the pixel defining layer to the base substrate, an area of a cross section of a guiding groove parallel to the base substrate decreases progressively, an area of a cross section of the pixel defining groove parallel to the base substrate decreases progressively, and an area of a minimum cross section of the guiding groove parallel to the base substrate is greater than an area of a maximum cross section of the pixel defining groove parallel to the base substrate.

In some embodiments, a depth of a guiding groove in each defining groove is greater than a depth of a pixel defining groove in the defining groove.

In some embodiments, an inner surface of the pixel defining groove is a hydrophilic surface, and an inner surface of the guiding groove and an inner surface of the communicating groove are both hydrophobic surfaces. Alternatively, an inner surface of the pixel defining groove is a hydrophobic surface, and an inner surface of the guiding groove and an inner surface of the communicating groove are both hydrophilic surfaces.

In another aspect, a display substrate is provided. The display substrate includes a base substrate and the pixel defining layer described in the above aspect disposed on one side of the base substrate. The display substrate further includes light-emitting films respectively formed in defining grooves of defining subunits in the pixel defining layer.

In some embodiments, the display substrate further includes first electrodes each disposed on a surface of a corresponding light-emitting film close to the base substrate, and at least one second electrode disposed on surfaces of light-emitting films away from the base substrate.

In yet another aspect, a method for manufacturing the display substrate described in the above aspect is provided. The method for manufacturing the display substrate includes: providing a base substrate; forming a pixel defining layer described in the above aspect on one side of the base substrate; supplying a film forming solution in a guiding groove of each defining subunit in each defining unit group of the pixel defining layer, the film forming solution in one of any two adjacent defining grooves in each defining unit group being able to flow into another of the any two adjacent defining grooves; and drying the film forming solution to form a light-emitting film in the guiding groove of each defining subunit.

In some embodiments, the step of supplying a film forming solution in the guiding groove of each defining subunit in each defining unit group of the pixel defining layer includes: supplying a film forming solution in the guiding groove of each defining subunit in each defining unit group of the pixel defining layer using an ink-jet printing process.

In yet another aspect, a display device is provided. The display device includes the display substrate described in the above aspect.

BRIEF DESCRIPTION OF THE DRAWINGS

The accompanying drawings described herein are intended to provide a further understanding of the present disclosure and constitute a part of the present disclosure. The illustrative embodiments of the present disclosure and the description thereof serve to explain the present disclosure, but do not constitute an undue limitation of the present disclosure. In the accompanying drawings.

DETAILED DESCRIPTION

Figure 1:
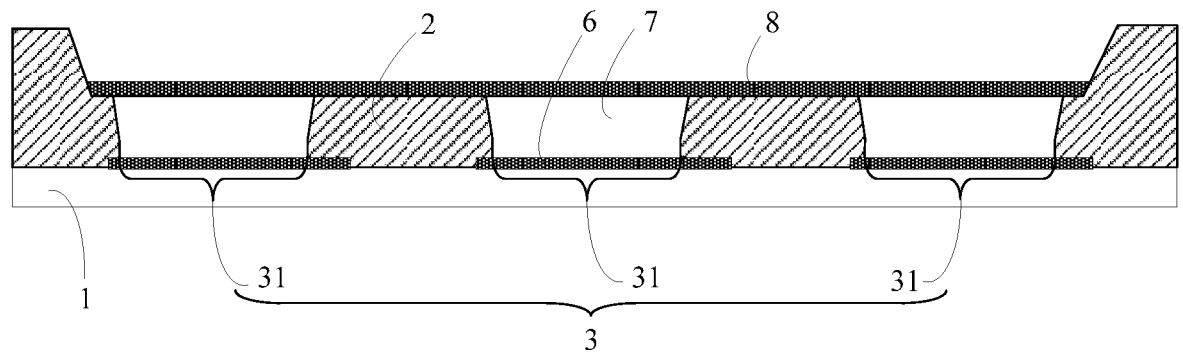
FIG. 1 is a schematic diagram showing a local structure of a display substrate according to some embodiments of the present disclosure.

The technical solutions in the embodiments of the present disclosure will be described clearly and completely below with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

When ink-jet printing technology is applied to the field of display technologies, a film forming material is usually formed into a film forming solution, and then the film forming solution is sprayed on regions of a base substrate by using a plurality of nozzles of an ink-jet printer, so that the film forming solution can form a film on a surface of the base substrate.

For example, in the process of manufacturing an organic light-emitting diode (OLED) display substrate using the ink jet printing technology, a plurality of light-emitting films of a same composition can be fabricated at the same time in corresponding pixel regions of the base substrate using the nozzles of the ink-jet printer. However, since it is difficult to accurately control a jet velocity of the film forming solution from each nozzle of the ink-jet printer, it is difficult to ensure that a volume of the film forming solution ejected by each nozzle of the ink-jet printer in a unit time is equal. As a result, a uniformity of films formed by the film forming solution is easily affected. That is, there is a difference between the light-emitting films in the pixel regions of the OLED display substrate, resulting in uneven illumination of the pixel regions, which may adversely affect a display effect of the OLED display substrate.

For this reason, some embodiments of the present disclosure provide a pixel defining layer. Referring to FIGS. 1-9, the pixel defining layer 2 includes at least one defining unit group 3 disposed on one side of a base substrate 1. Each defining unit group 3 includes a plurality of defining subunits 31, and each defining subunit 31 is provided with a defining groove 4. Defining grooves 4 of any two adjacent defining subunits 31 in each defining unit group 3 are communicated with each other.

In some embodiments, a surface of the base substrate 1 is provided with electronic devices or circuit structure(s) according to actual needs. In some examples, the surface of the base substrate 1 is provided with a pixel circuit layer, and the pixel circuit layer includes pixel driving circuits and driving electrodes correspondingly connected to the pixel driving circuits. In this case, "the pixel defining layer 2 is disposed on one side of the base substrate 1" refers to that the pixel defining layer 2 is disposed on a surface of the pixel circuit layer away from the base substrate 1. In some other examples, the base substrate 1 is a blank base substrate on which no electronic device or circuit structure is produced. In this case, "the pixel defining layer 2 is disposed on one side of the base substrate 1" refers to that the pixel defining layer 2 is disposed on a surface of the base substrate 1.

The pixel defining layer 2 is configured to accurately define each pixel region, and the pixel defining layer 2 includes a plurality of defining subunits 31 that are disposed to be in one-to-one correspondence with respective pixel regions. According to the composition of the film that needs to be formed in the defining groove 4 of each defining subunit 31, the defining subunits 31 of the pixel defining layer 2 may be classified into at least one defining unit group 3, so as to ensure that each defining unit group is configured to define a kind of films of the same composition, such as light-emitting films.

For example, the pixel defining layer 2 is a pixel defining layer of an OLED display substrate, and each defining unit group 3 of the pixel defining layer 2 is configured to define a kind of light-emitting films of the same composition. For example, light-emitting films that emit a certain color of light are formed respectively at positions corresponding to each column of pixel regions in the OLED display substrate, and any three adjacent columns of pixel regions are red light pixel regions, green light pixel regions and blue light pixel regions respectively. The defining subunits 31 corresponding to red light pixel regions constitute a first defining unit group, which is configured to define red light-emitting films. The defining subunits 31 corresponding to green light pixel regions constitute a second defining unit group, which is configured to define green light-emitting films. The defining subunits 31 corresponding to blue light pixel regions constitute a third defining unit group, which is configured to define blue light-emitting films.

In the process of manufacturing the light-emitting films in the pixel defining layer 2 described above using the ink-jet printing technology, since the defining grooves 4 of any two adjacent defining subunits 31 in each defining unit group 3 are communicated with each other, the film forming solution ejected by nozzles of the ink-jet printer is able to flow from the defining groove 4 of one of the any two adjacent defining subunits 31 to the defining groove 4 of another of the any two adjacent defining subunits 31 after entering the defining grooves 4 of the any two adjacent defining subunits 31, so that a volume of film forming solution in the defining grooves of the any two adjacent defining subunits 31 may be homogenized. For example, in each defining unit group 3, if the volume of film forming solution in the defining groove 4 of a certain defining subunit 31 is relatively larger, it is easy for the film forming solution in the defining groove 4 to flow into an adjacent defining groove 4 with a smaller volume of film forming solution, so that the volume of film forming solution in the defining grooves 4 of the defining subunits 31 of the defining unit group 3 may be made equal, thereby realizing an effect that the film forming solution in different defining subunits 31 complements each other to be homogenized. In some embodiments, after the film forming solution is mutually complemented between the defining subunits 31, the volume of film forming solution contained in the defining grooves 4 of the defining subunits 31 of each defining unit group 3 is made equal. That is to say, the films formed respectively in the defining grooves 4 of the defining subunits 31 of each defining unit group 3 are equal in thickness.

In this way, in a case where it is difficult to accurately control the jet velocity of the film forming solution from each nozzle of the ink-jet printer and there is a difference between the volumes of film forming solution ejected into the defining grooves 4 of each defining unit group 3 in a same time period, since the film forming solution in one of any two adjacent defining grooves 4 is able to autonomously flow into another of the any two adjacent defining grooves 4, a difference in volume of the film forming solution in each defining groove 4 may be effectively eliminated. As a result, the volume of film forming solution in each defining groove 4 in each defining unit group tends to be equal, thereby ensuring the uniformity of films formed by the film forming solution. Therefore, when the pixel defining layer 2 provided in the embodiments of the present disclosure is applied to an OLED display substrate, the uniformity of light-emitting films formed in the pixel regions of the OLED display substrate may be increased, and a display effect of the OLED display substrate may be improved.

In addition, each defining unit group 3 of the pixel defining layer 2 is configured to define a kind of light-emitting films of the same composition. In this way, it may be ensured that the film forming solution in the defining grooves 4 of the defining subunits 31 of the same defining unit group 3 is not prone to contamination due to two-way flow of the film forming solution in two adjacent defining grooves. That is, a purity of the light-emitting films formed in the defining grooves 4 of the defining subunits 31 of each defining unit group 3 may be effectively guaranteed. Thus, when different light-emitting films are used for emitting different colors of light, the pixel defining layer 2 provided in some embodiments of the present disclosure is able to ensure a chromaticity of different light-emitting films, so as to realize color display of the display substrate where the pixel defining layer 2 is located.

In some embodiments, with continued reference to FIGS. 2-9, each defining groove 4 includes a pixel defining groove 41 and a guiding groove 42 communicated with the pixel defining groove 41, and the guiding groove 42 is located at a side of the pixel defining groove 41 away from the base substrate 1. Any two adjacent guiding grooves 42 in each defining unit group 3 are communicated with each other by a communicating groove 5.

The pixel defining groove 41 is configured to define an effective light-emitting area, that is, a light-emitting region of a corresponding pixel region. The pixel defining groove 41 is, for example, a rectangular groove or an inverted trapezoidal groove. In some examples, in the pixel defining layer 2, especially in each defining unit group 3, the pixel defining grooves 41 of the defining grooves 4 of the defining subunits 31 have a same structure. Optionally, each pixel defining groove 41 in each defining unit group 3 has a same depth $h_1$. In this way, a liquid level of the film forming solution contained in each pixel defining groove 41 in each defining unit group (that is, a size of the film forming solution in a direction of the depth $h_1$ of the pixel defining groove 41) may be kept equal.

In each defining subunit 31, the guiding groove 42 of the defining groove 4 is located at a side of the pixel defining groove 41 of the same defining groove 4 away from the base substrate 1, and is communicated with the pixel defining groove 41. That is to say, the guiding groove 42 of a defining subunit 3 may serve as an overflow groove of the pixel defining groove 41 of the same defining subunit 3, so that the film forming solution directly flows into the guiding groove 42 when overflowing from the pixel defining groove 41.

Figure 2:
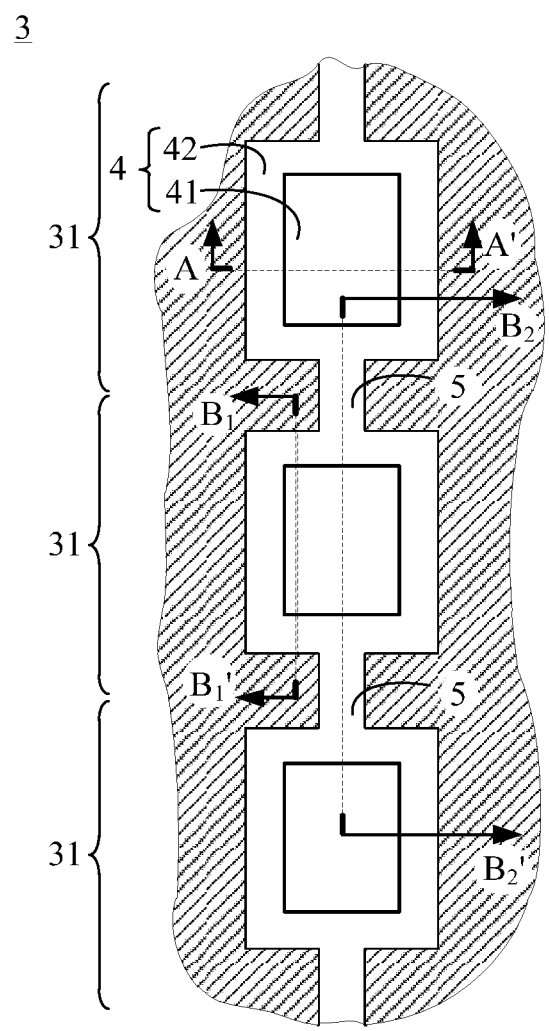
FIG. 2 is a schematic diagram showing a local structure of a pixel defining layer according to some embodiments of the present disclosure.
Figure 3:
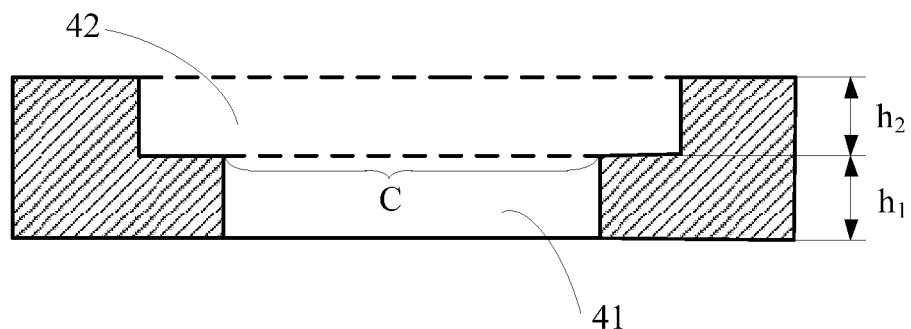
FIG. 3 is a cross-section diagram of the pixel defining layer shown in FIG. 2 taken along line A-A.
Figure 4:
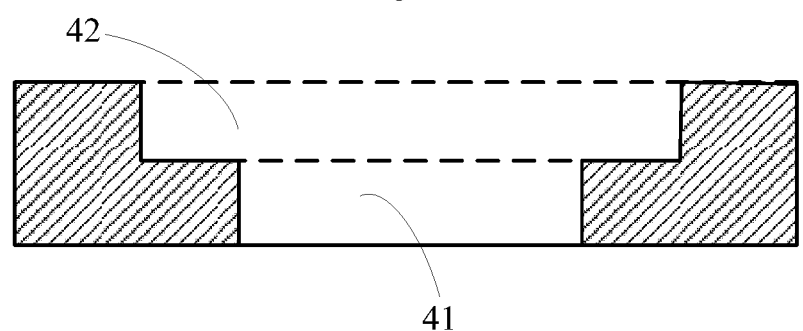
FIG. 4 is a cross-section diagram of the pixel defining layer shown in FIG. 2 taken along line $B_1$-$B_1'$.
Figure 5:
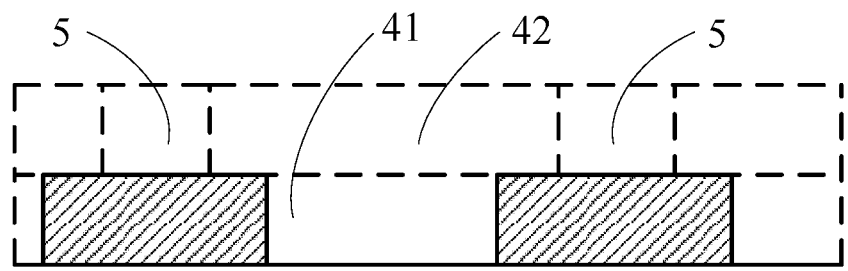
FIG. 5 is a cross-section diagram of the pixel defining layer shown in FIG. 2 taken along line $B_2$-$B_2'$.
Figure 6:
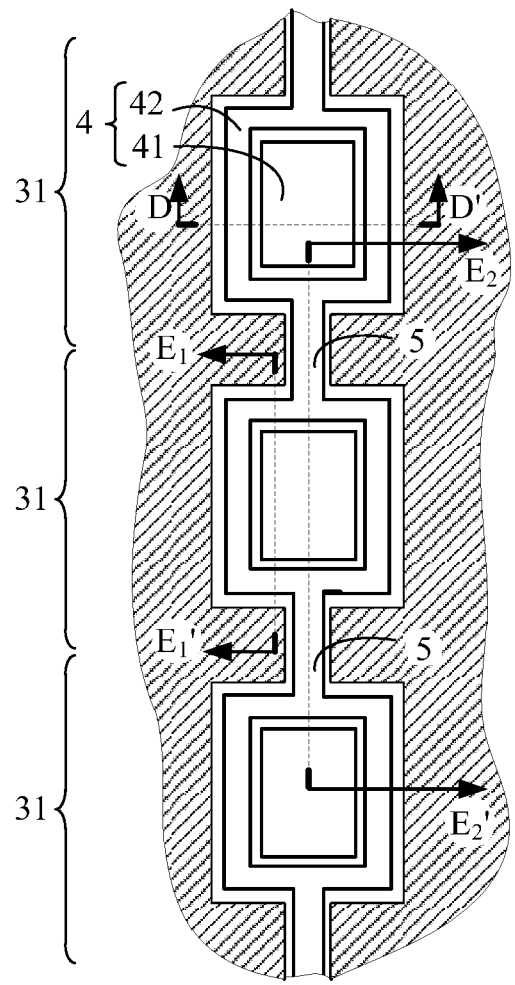
FIG. 6 is a schematic diagram showing a local structure of another pixel defining layer according to some embodiments of the present disclosure.
Figure 7:
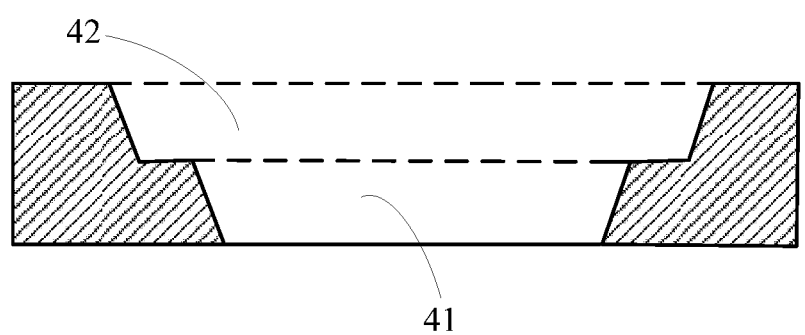
FIG. 7 is a cross-section diagram of the pixel defining layer shown in FIG. 6 taken along line D-D'.
Figure 8:
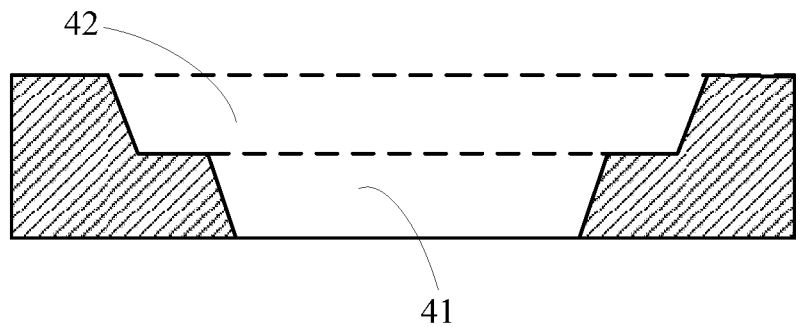
FIG. 8 is a cross-section diagram of the pixel defining layer shown in FIG. 6 taken along line $E_1$-$E_1'$.
Figure 9:
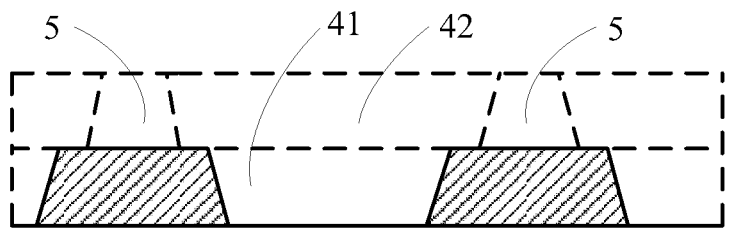
FIG. 9 is a cross-section diagram of the pixel defining layer shown in FIG. 6 taken along line $E_2$-$E_2'$.

For example, referring to FIGS. 2 and 3, the guiding groove 42 and the pixel defining groove 41 of the same defining groove 4 are arranged in a stepped manner. In each defining groove 4, a bottom surface of the guiding groove 42 is provided with an opening C directly facing the pixel defining groove 41, an orthographic projection of the pixel defining groove on the base substrate is within an orthographic projection of the opening on the base substrate, and the pixel defining groove 41 is exposed in the opening C. In some embodiments, the opening C directly faces the pixel defining groove 41, and an orthographic projection of the opening C on the base substrate overlaps with an orthographic projection of the pixel defining groove 41 on the base substrate. In this case, the opening C may be considered to be a top opening of the pixel defining groove 41. When a volume of the film forming solution injected into a pixel defining groove 41 is greater than a capacity of the pixel defining groove 41, the film forming solution will overflow into a corresponding guiding groove 42 through a corresponding opening C.

Since any two adjacent guiding grooves 42 in each defining unit group 3 are communicated with each other by a communicating groove 5, when a volume of the film forming solution overflowing into a certain guiding groove 42 is greater than a volume of the film forming solution in an adjacent guiding groove 42, the film forming solution in the certain guiding groove 42 will autonomously flow into the adjacent guiding groove 42 through the communicating groove 5. In some examples, bottom surfaces of any two adjacent guiding grooves 42 in each defining unit group 3 are in a same plane, so that the liquid level of the film forming solution in each guiding groove 4 in each defining unit group 3 (that is, a size of the film forming solution in a direction of a depth $h_2$ of the guiding groove 4) tends to be equal after two-way flow of the film forming solution.

In addition, optionally, a bottom surface of each communicating groove 5 is in a same plane as bottom surfaces of two guiding grooves 42 that are communicated with the communicating groove 5. In this way, the film forming solution in one of two adjacent guiding grooves 42 is not restricted from flowing into another of the two adjacent guiding grooves due to existence of the communicating groove 5, which makes it even easier for the film forming solution in one of two adjacent guiding grooves 42 in each defining unit group 3 to flow into the other one of the two adjacent guiding grooves 42. Therefore, when manufacturing light-emitting films in the pixel regions of the pixel defining layer 2, it is possible to further ensure that thicknesses of light-emitting films formed in the defining grooves 4 of the defining subunits 31 of each defining unit group 3 are uniform, that is, to make the thicknesses of the light-emitting films in different pixel regions equal.

It will be understood that, in some embodiments, according to the film forming requirements of each defining groove 4, the bottom surface of each communicating groove 5 is higher than or lower than the bottom surfaces of the two guiding grooves 42 that are communicated with the communicating groove 5.

For example, the bottom surface of each communicating groove 5 is lower than the bottom surfaces of two guiding grooves 42 that are communicated with the communicating groove 5. In this way, when the film forming solution overflowing into the guiding groove 42 flows into an adjacent guiding groove 42, the film forming solution will first flow into a corresponding communicating groove 5. Only when a liquid level of the film forming solution in the communicating groove 5 is higher than the bottom surface of a corresponding guiding groove 42 can the film forming solution in the two adjacent guiding grooves 42 flow from one guiding groove to another. Thus, by arranging a height difference between the bottom surface of the communicating groove 5 and the bottom surfaces of the guiding grooves 42, it is possible to effectively obtain a desired thickness of film formed in the defining groove 4, for example, a thickness equal to a depth $h_1$ of the pixel defining groove 41 of the defining groove 4.

For another example, the bottom surface of each communicating groove 5 is higher than the bottom surfaces of two guiding grooves 42 that are communicated with the communicating groove 5. In this way, the film forming solution overflowing into the guiding grooves 42 will only be able to flow from one guiding groove to another when the liquid level of the film forming solution overflowing into the guiding grooves 42 is higher than the bottom surface of a corresponding communicating groove 5. Thus, by arranging a height difference between the bottom surface of the communicating groove 5 and the bottom surfaces of the guiding grooves 42, that is, arranging a height difference between the bottom surface of the communicating groove 5 and the bottom surfaces of the pixel defining grooves 41, it is possible to effectively obtain a desired thickness of film formed in the defining groove 4, for example, a thickness equal to at least a distance between the bottom surface of the communicating groove 5 and the bottom surfaces of the pixel defining grooves 41 in the defining grooves 4.

In some embodiments, the desired thickness of film formed in the defining groove 4 is greater than the depth $h_1$ of the pixel defining groove 41, and the depth $h_2$ of the guiding groove 42 of each defining groove 4 is greater than the depth $h_1$ of the pixel defining groove 41 of the same defining groove 4. Thus, in the process of manufacturing light-emitting films in the defining grooves 4 using an ink-jet printer, the pixel defining groove 41 is shallower in depth, and thus the film forming solution may fill the pixel defining groove 41 in each defining groove 4 more easily and overflow into the corresponding guiding groove 42, so that the film forming solution in different defining grooves 4 may complement each other as soon as possible through two-way flow of the film forming solution in two adjacent guiding grooves. As a result, a speed in which a difference in volume between the film forming solution in different defining grooves 4 is eliminated is increased, and the uniformity of films formed by the film forming solution is ensured.

With continued reference to FIGS. 2-9, in each defining groove 4 provided in some embodiments, a pixel defining groove 41 is configured to define a light-emitting area of a corresponding pixel region, and the pixel defining groove 41 is in a regular shape, for example, is a rectangular groove (as shown in FIGS. 2-5) or an inverted trapezoidal groove (as shown in FIGS. 6-9). A guiding groove 42 of the same defining groove 4 serves as an overflow groove of the pixel defining groove 41. The guiding groove 42 may have a structure similar to the pixel defining groove 41 or a completely different structure. It will be noted that, an orthographic projection of a pixel defining groove 41 of each defining groove 4 on the base substrate 1 is within an orthographic projection of a guiding groove 42 of the same defining groove 4 on the base substrate 1. That is to say, after using the pixel defining groove 41 to effectively control the light-emitting area of the corresponding pixel region, the film forming solution overflowing from the pixel defining groove 41 may overflow into the corresponding guiding groove 42 in any direction, so as to realize homogenization through two-way flow of the film forming solution in two adjacent guiding grooves 42.

For example, referring to FIGS. 6-9, in each defining groove 4, along a direction from the pixel defining layer to the base substrate, an area of a cross section of a guiding groove 42 parallel to the base substrate decreases progressively, an area of a cross section of a pixel defining groove 41 parallel to the base substrate decreases progressively, and an area of a minimum cross section of the guiding groove 42 parallel to the base substrate is greater than an area of a maximum cross section of the pixel defining groove 41 parallel to the base substrate. For example, the guiding groove 42 and the pixel defining groove 41 are both inverted trapezoidal grooves, and the guiding groove 42 and the pixel defining groove 41 of the same defining groove 4 are arranged in a stepped manner. An area of a maximum cross section of the pixel defining groove 41 parallel to the base substrate is an area of the top opening thereof, and an area of a minimum cross section of the guiding groove 42 parallel to the base substrate is an area of a bottom surface thereof. Since the area of the bottom surface of the guiding groove 42 is greater than the area of the top opening of the pixel defining groove 41, and walls of the pixel defining groove 41 and the guiding groove 42 are inclined, the film forming solution may easily and stably overflow from the top opening of the pixel defining groove 41 to the guiding groove 42, and the film forming solution in the guiding groove 42 may flow into an adjacent guiding groove 42 and vice versa.

It will be noted that, the film forming solution is usually obtained by dissolving a film forming material in a corresponding solvent. In some examples, the solvent in which the film-forming material is dissolved is a hydrophilic solvent, and the film forming solution is hydrophilic. In each defining subunit 31 provided in some embodiments, an inner surface of the pixel defining groove 41 is a hydrophilic surface, and an inner surface of the guiding groove 42 and an inner surface of the communicating groove 5 are both hydrophobic surfaces. Thus, when a hydrophilic film forming solution is provided in each defining groove 4 (i.e., the pixel defining groove 41 and the guiding groove 42), not only can the film forming solution adhere to the inner surface of the pixel defining groove 41 very well, but also the film forming solution can flow smoothly to an adjacent defining groove through the communicating groove 5 after the film forming solution overflows into the guiding groove 42. In addition, after the film forming solution in two adjacent guiding grooves 42 becomes equal after two-way flow, during the drying process of the film forming solution, for example, during the process of evaporating the solvent contained in the film forming solution, it is difficult for the hydrophilic solvent contained in the film forming solution to remain in the communicating groove 5 and the guiding grooves 42. As a result, the film forming material contained in the film forming solution in the communicating groove 5 and the guiding groove 42 will gradually retract toward the pixel defining groove 41 during the process of evaporating the hydrophilic solvent. Therefore, it is ensured that the film is preferentially formed in the pixel defining groove 41 in the defining groove 4 (i.e., the pixel defining groove 41 and the guiding groove 42).

In some other examples, the solvent in which the film-forming material is dissolved is a hydrophobic solvent, and the film forming solution is hydrophobic. In each defining subunit 31 provided in some embodiments, an inner surface of the pixel defining groove 41 is a hydrophobic surface, and an inner surface of the guiding groove 42 and an inner surface of the communicating groove 5 are both hydrophilic surfaces. Thus, when a hydrophobic film forming solution is provided in each defining groove 4 (i.e., the pixel defining groove 41 and the guiding groove 42), not only can the film forming solution adhere to the inner surface of the pixel defining groove 41 very well, but also the film forming solution can flow smoothly to an adjacent defining groove through the communicating groove 5 after the film forming solution overflows into the guiding groove 42. In addition, after the film forming solution in two adjacent guiding grooves 42 becomes equal after two-way flow, during the drying process of the film forming solution, for example, during the process of evaporating the solvent contained in the film forming solution, it is difficult for the hydrophobic solvent contained in the film forming solution to remain in the communicating groove 5 and the guiding grooves 42. As a result, the film forming material contained in the film forming solution in the communicating groove 5 and the guiding groove 42 will gradually retract toward the pixel defining groove 41 during the process of evaporating the hydrophobic solvent. Therefore, it is ensured that the film is preferentially formed in the pixel defining groove 41 in the defining groove 4 (i.e., the pixel defining groove 41 and the guiding groove 42).

Some embodiments of the present disclosure provide a display substrate. As shown in FIG. 1, the display substrate includes a base substrate 1 and a pixel defining layer 2 disposed on one side of the base substrate 1. The pixel defining layer 2 is the pixel defining layer described in the above embodiments. The display substrate further includes light-emitting films 7 respectively disposed in defining grooves of defining subunits 31 in the pixel defining layer 2. For example, the light-emitting films are disposed in pixel defining grooves of the defining grooves respectively. For another example, the light-emitting films are disposed in both pixel defining grooves and guiding grooves of the defining grooves. The beneficial effects of the display substrate provided in the embodiments are the same as those of the pixel defining layer 2 provided in the above embodiments, and are not described herein again.

In some embodiments, the display substrate is an OLED display substrate. In this case, the light-emitting film 7 to be formed in each defining groove of the pixel defining layer 2 needs to be located between a first electrode and a second electrode that are oppositely disposed, so that the first electrode, the light-emitting film and the second electrode together constitute an OLED device. For example, the OLED display substrate includes first electrodes 6 respectively disposed on surfaces of the light-emitting films 7 close to the base substrate 1, and at least one second electrode 8 disposed on surfaces of the light-emitting films 7 away from the base substrate 1. Each first electrode 6 is an anode made of an indium tin oxide (ITO) material, and the at least one second electrode 8 is a cathode made of a metal, such as silver (Ag) or molybdenum (Mo). Optionally, the at least one second electrode 8 in the OLED display substrate includes a single second electrode corresponding to OLED devices, so that the second electrode 8 of the OLED devices may be integrally formed, thus simplifying a production process of the second electrode 8.

In the OLED display substrate provided in some embodiments, the pixel regions defined by the pixel defining layer 2 are arranged in an array. In some examples, the OLED display substrate displays in RGB mode, light-emitting films that emit a certain color of light are respectively disposed at positions corresponding to each column of pixel regions in the OLED display substrate, and any three adjacent columns of pixel regions are red light pixel regions, green light pixel regions and blue light pixel regions respectively. Correspondingly, the defining subunits 31 corresponding to a single column of pixel regions are classified into a single defining unit group 3, which is configured in a way that a kind of light-emitting films of the same composition is formed in the defining unit group 3. The defining unit group 3 corresponding to each column of red light pixel regions is configured to define the red light-emitting films. The defining unit group 3 corresponding to each column of green light pixel regions is configured to define the green light-emitting films. The defining unit group 3 corresponding to each column of blue light pixel regions is configured to define the blue light-emitting films.

Of course, if light-emitting films that emit a certain color of light are respectively disposed at positions corresponding to each row of pixel regions of the OLED display substrate, and any three adjacent rows of pixel regions are red light pixel regions, green light pixel regions and blue light pixel regions respectively, the defining subunits 31 corresponding to a single row of pixel regions are classified into a single defining unit group 3, which is configured in a way that a kind of light-emitting films of the same composition is formed in the defining unit group 3.

Figure 10:
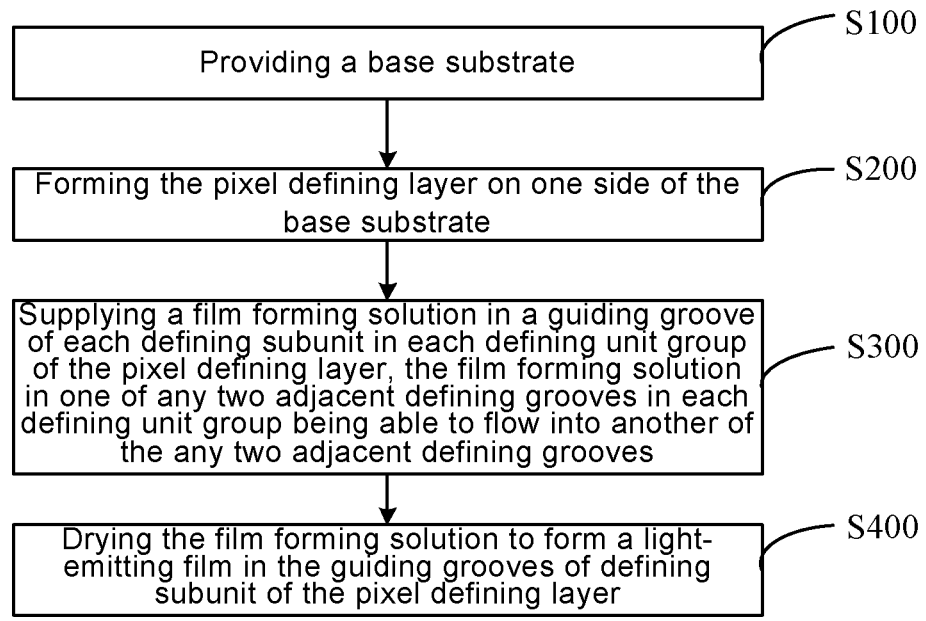
FIG. 10 is a flow chart of a method for manufacturing a display substrate according to some embodiments of the present disclosure.

Some embodiments of the present disclosure provide a method for manufacturing a display substrate, which is used for manufacturing the display substrate described in the above embodiments. Referring to FIG. 10, the method for manufacturing a display substrate includes steps 100-400 (S100-S400).

In S100, a base substrate is provided.

The base substrate serves as a base for the pixel defining layer. The surface of the base substrate is usually fabricated with electronic devices or circuit structure(s) according to actual needs. Alternatively, the base substrate is a blank base substrate on which no electronic device or circuit structure is produced.

In S200, the pixel defining layer described in the above embodiments is formed on one side of the base substrate.

According to structures of the base substrate, "the pixel defining layer is formed on one side of the base substrate" includes two situations: a pixel defining layer is formed on a surface of the base substrate; alternatively, a pixel circuit layer is formed on a surface of the base substrate, and then a pixel defining layer is formed on a surface of the pixel circuit layer away from the base substrate.

In S300, a film forming solution is formed in a guiding groove of each defining subunit in each defining unit group of the pixel defining layer, wherein the film forming solution in one of any two adjacent defining grooves in each defining unit group is able to flow into another of the any two adjacent defining grooves.

The pixel defining layer is configured to accurately define each pixel region, and the pixel defining layer includes a plurality of defining subunits that are disposed to be in one-to-one correspondence with respective pixel regions. According to the composition of the film that needs to be formed in the defining groove 4 of each defining subunit 31, the defining subunits 31 of the pixel defining layer 2 may be classified into at least one defining unit group, so as to ensure that each defining unit group is configured to define a kind of films of the same composition.

Optionally, the film forming solution is provided by an ink-jet printing process, that is, the film forming solution is formed in the defining groove of each defining subunit in each defining unit group of the pixel defining layer using an ink-jet printing process. Of course, a manner in which the film forming solution is formed in each defining groove is not limited thereto, and other methods of injecting the film forming solution into the respective defining grooves may be used.

In S400, the film forming solution is dried to form a light-emitting film in the guiding groove of each defining subunit.

According to film forming characteristics of the film forming solution, the film forming solution is dried to solidify the film forming solution, so that the light-emitting film required for the display substrate may be formed in the defining groove of each defining subunit.

The beneficial effects of the method for manufacturing the display substrate provided in some embodiments of the present disclosure are the same as those of the pixel defining layer provided in the above embodiments, and are not described herein again.

Figure 11:
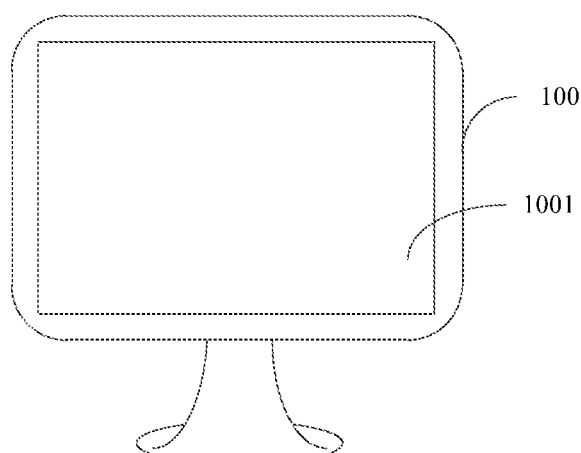
FIG. 11 is a schematic diagram showing a structure of a display device according to some embodiments of the present disclosure.

As shown in FIG. 11, some embodiments of the present disclosure provide a display device 100, which includes the display substrate 1001 described in the above embodiments. The display device has the same structure and beneficial effects as those of the display substrate provided in the above embodiments, which are not described herein again.

In addition, for example, the above display device is an OLED display panel, an OLED display, an OLED television, a cellphone, a tablet computer, a notebook computer, an electronic paper, a digital photo frame, a navigator, or any product or component having a display function.

In the description of the above embodiments, specific features, structures, materials or characteristics may be combined in any suitable manner in any one or more embodiments or examples.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A pixel defining layer, comprising at least one defining unit group disposed on one side of a base substrate, each defining unit group comprising a plurality of defining subunits, each defining subunit being provided with a defining groove, wherein
    defining grooves of any two adjacent defining subunits in each defining unit group are communicated with each other, wherein
    each defining groove comprises:
    a pixel defining groove; and
    a guiding groove communicated with the pixel defining groove, the guiding groove being disposed at a side of the pixel defining groove away from the base substrate, wherein
    the pixel defining layer further includes a communicating groove disposed between any two adjacent guiding grooves in each defining unit group, so that the any two adjacent guiding grooves in each defining unit group are communicated with each other by the communicating groove.

2. The pixel defining layer according to claim 1, wherein each defining unit group is configured to define a kind of light-emitting films of a same composition.

3. The pixel defining layer according to claim 1, wherein each pixel defining groove in each defining unit group has a same depth.

4. The pixel defining layer according to claim 1, wherein in each defining groove, a bottom surface of a guiding groove is provided with an opening directly facing a pixel defining groove, and an orthographic projection of the pixel defining groove on the base substrate is within an orthographic projection of the opening on the base substrate.

5. The pixel defining layer according to claim 1, wherein bottom surfaces of any two adjacent guiding grooves in each defining unit group are in a same plane.

6. The pixel defining layer according to claim 5, wherein a bottom surface of each communicating groove is in a same plane as bottom surfaces of two guiding grooves that are communicated with the communicating groove.

7. The pixel defining layer according to claim 1, wherein an orthographic projection of a pixel defining groove of each defining groove on the base substrate is within an orthographic projection of a guiding groove of the defining groove on the base substrate.

8. The pixel defining layer according to claim 7, wherein in each defining groove, along a direction from the pixel defining layer to the base substrate, an area of a cross section of a guiding groove parallel to the base substrate decreases progressively, an area of the a cross section of a pixel defining groove parallel to the base substrate decreases progressively, and an area of a minimum cross section of the guiding groove parallel to the base substrate is greater than an area of a maximum cross section of the pixel defining groove parallel to the base substrate.

9. The pixel defining layer according to claim 1, wherein a depth of a guiding groove in each defining groove is greater than a depth of a pixel defining groove in the defining groove.

10. The pixel defining layer according to claim 1, wherein
    an inner surface of the pixel defining groove is a hydrophilic surface, and an inner surface of the guiding groove and an inner surface of the communicating groove are both hydrophobic surfaces; or
    an inner surface of the pixel defining groove is a hydrophobic surface, and an inner surface of the guiding groove and an inner surface of the communicating groove are both hydrophilic surfaces.

11. A display substrate, comprising:
    a base substrate;
    the pixel defining layer according to claim 1 disposed on one side of the base substrate; and
    light-emitting films respectively disposed in defining grooves of defining subunits in the pixel defining layer.

12. The display substrate according to claim 11, further comprising first electrodes each disposed on a surface of a corresponding light-emitting film close to the base substrate, and at least one second electrode disposed on surfaces of the light-emitting films away from the base substrate.

13. A method for manufacturing the display substrate according to claim 11, the method comprising:
   providing a base substrate;
   forming the pixel defining layer according to claim 1 on one side of the base substrate; and
   supplying a film forming solution in a guiding groove of each defining subunit in each defining unit group of the pixel defining layer, the film forming solution in one of any two adjacent defining grooves in each defining unit group being able to flow into another of the any two adjacent defining grooves; and
   drying the film forming solution to form a light-emitting film in the guiding groove of each defining subunit of the pixel defining layer.

14. The method for manufacturing a display substrate according to claim 13, wherein supplying a film forming solution in the guiding groove of each defining subunit in each defining unit group of the pixel defining layer, comprises:
   supplying a film forming solution in the guiding groove of each defining subunit in each defining unit group of the pixel defining layer using an ink-jet printing process.

15. A display device, comprising the display substrate according to claim 11.

* * * * *